United States Patent [19]
Hshieh

[11] Patent Number: 6,005,271
[45] Date of Patent: Dec. 21, 1999

[54] SEMICONDUCTOR CELL ARRAY WITH HIGH PACKING DENSITY

[75] Inventor: Fwu-Iuan Hshieh, Saratoga, Calif.

[73] Assignee: MagePower Semiconductor Corp., San Jose, Calif.

[21] Appl. No.: 08/964,775

[22] Filed: Nov. 5, 1997

[51] Int. Cl.$^6$ .......................... H01L 29/76; H01L 31/062
[52] U.S. Cl. .......................... 257/341; 257/331; 257/401
[58] Field of Search ...................................... 257/331, 341, 257/401

[56] References Cited

U.S. PATENT DOCUMENTS

5,136,349   8/1992   Yilmaz et al. ............................ 257/341

Primary Examiner—Mahshid Saadat
Assistant Examiner—George C. Eckert, II
Attorney, Agent, or Firm—Kam T. Tam

[57] ABSTRACT

A MOSFET (Metal Oxide Semiconductor Field Effect Transistors) cell array formed on a semiconductor substrate includes a major surface formed with a plurality of MOSFET cells. Each semiconductor cell in the cell array is geometrically configured with a base portion and a plurality of protruding portions extending from the base portion. The base and protruding portions define a closed cell boundary enclosing each semiconductor cell. The closed cell boundary of each semiconductor cell is disposed on the major surface proximal to and in geometrical accord with the corresponding cell boundaries of other adjacent semiconductor cells in the cell array. As arranged, the cell boundary and thus the channel width of each cell is extended without any concomitant reduction in cell area.

19 Claims, 11 Drawing Sheets

SEMICONDUCTOR CELL ARRAY WITH HIGH PACKING DENSITY

BACKGROUND OF THE INVENTION

1. Field of the Invention

The present invention relates generally to microelectronic circuits, and more particularly, to power MOSFET (Metal Oxide Semiconductor Field Effect Transistor) circuits having high packing densities.

2. Description of the Related Art

Figure 1:
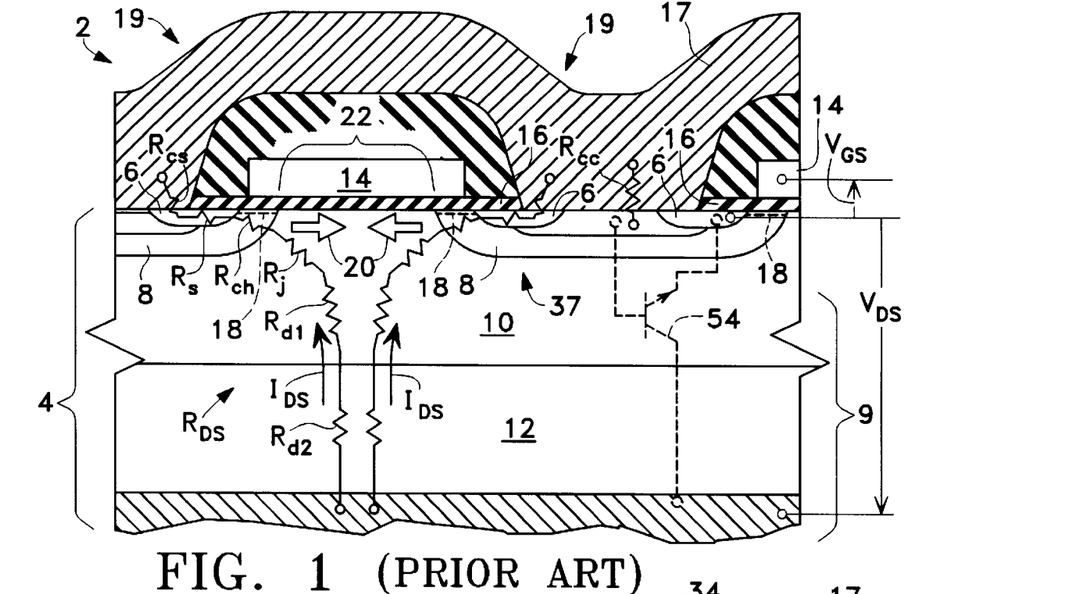
FIG. 1, as described above, is a cross-sectional view of a conventional planar MOSFET cell array.

Power semiconductor devices have long been used as replacement for mechanical relays in various applications. Development in semiconductor technology enables these power devices to operate with high reliability and performance. FIG. 1 shows a conventional MOSFET (Metal Oxide Semiconductor Field Effect Transistor) array arranged on a planar configuration. The MOSFET array is generally signified by the reference numeral 2. The array 2 comprises a substrate 4 which is deposited with various diffusion or implant regions. For example, there are source regions 6 which are heavily doped with N-type material. Similarly, there are body regions 8 which are doped with P-type material. The drain 9 comprises an epitaxial layer 10 deposited in contact with a heavily doped drain contact layer 12 formed of N-type material. A plurality of polysilicon gates 14 is also disposed above the substrate 4 spaced by gate oxide layers 16. The polysilicon gates 14 are electrically connected together via bridging traces not shown in FIG. 1. Similarly, the sources 6 are electrically tied together via a source metal layer 17.

During normal operations, the sources 6 are connected to the ground potential via the source metal layer 17. At the same time, a positive potential is applied across the drain 9 and the source regions 6. A drain-to-source voltage $V_{DS}$ is established. In a similar fashion, a gate-to-source voltage $V_{GS}$ is also applied across the gates 14 and the source regions 6. The $V_{GS}$ voltage capacitively induces N-type channels 18 underneath the gate oxide layers 16. The channel 18 allows the $V_{DS}$ voltage to drive a drain-to-source current $I_{DS}$ from the drain 9 to the source regions 6. The MOSFET 2 is said to be at the power-on state.

The current path where the drain-to-source current $I_{DS}$ flows is predominantly resistive and the resistance value is called the drain-to-source $R_{DS}$ of the MOSFET. In a power MOSFET device, there is a plurality of individual MOSFETs 19 fabricated together to form the MOSFET array 2. The aggregate resistance values of the drain-to-source resistance $R_{DS}$ during the power-on state is called the power-on resistance $R_{ON}$ of the MOSFET array 2.

It has been a constant design goal to make MOSFET arrays with low power-on resistance $R_{ON}$. Lower power-on resistance $R_{ON}$ not only curtails power consumption and thus cuts down the wasteful heat dissipation of the MOSFET array 2, it also prevents the MOSFET array 2 from robing away any intended driving voltage $V_{CC}$ to any circuits that the MOSFET array 2 drives. Specifically, lower Ohmic drop passing through the MOSFET array 2 during normal operations avails any circuits driven by the MOSFET 2 with a less distorted driving voltage $V_{CC}$.

The advent of high resolution photolithography allows semiconductor components to be formed on a semiconductor substrate with ultra fine geometries. Accordingly, to reduce the power-on resistance $R_{ON}$ of any MOSFET arrays, one conventional approach is to densely integrate the MOSFETs 19 on the semiconductor substrate 4. The rationale behind this approach is that the higher the number of MOSFETs 19 operating in parallel, the lower the overall power-on resistance $R_{ON}$ results in the MOSFET array 2. However, theoretical feasible as it appears, there are various technical complications associated with densely integrating a planar MOSFET array 2.

Reference is now directed back to FIG. 1 which shows the countervailing factors commonly frustrating the attempts of densely integrating a planar MOSFET device. As mentioned before, advanced development in high definition photolithography allows denser device integration. As integration density increases, cell-to-cell separations decrease. As shown in FIG. 1, the drain-to-source resistance $R_{DS}$ of each cell during the power-on state can be approximated by the following algebraic equation:

$$R_{DS}=R_{cs}+R_S+R_{ch}+R_j+R_{d1}+R_{d2} \qquad (1)$$

where $R_{CS}$ is the contact resistance of the source metal 17 to the source region 6; $R_s$ is the source resistance; $R_{ch}$ is the channel resistance; $R_j$ is the junction resistance; $R_{d1}$ is the drain resistance at the epitaxial region 10; and $R_{d2}$ is the drain resistance at the drain contact region 12 in ohms. The dominant components are the junction resistance $R_j$ and the drain resistance $R_{d1}$ at the epitaxial region 10. First, the epitaxial layer 10 is lightly doped and consequently assumes a high resistivity. Furthermore, the epitaxial region 10 is also a relatively thick layer and therefore extends a longer resistive path. As integration density increases, the diffusion regions, such as the source diffusion regions 6 and the body diffusion regions 18 among the MOSFET cells 2 encroach closer and closer toward each other as illustrated by the directions 20 shown in FIG. 1. Consequently, during the power-on state, the drain-to-source current $I_{DS}$ of each cell only has a limited resistive area to pass through. As shown in FIG. 1, basically, the region signified by the reference numeral 22 has to be shared by two MOSFET cells 19. As is known in the art, the smaller the area of the resistive path, the higher is the resistance value. Equally as detrimental is the current crowding effect in the confined region 22 which also plays a dominant role in increasing the values of the resistances $R_j$ and $R_{d1}$. Accordingly, the advantage gained in pursuing higher density integration can be totally negated by the increase in drain and junction resistances $R_{d1}$ and $R_j$ as explained above.

Figure 2:
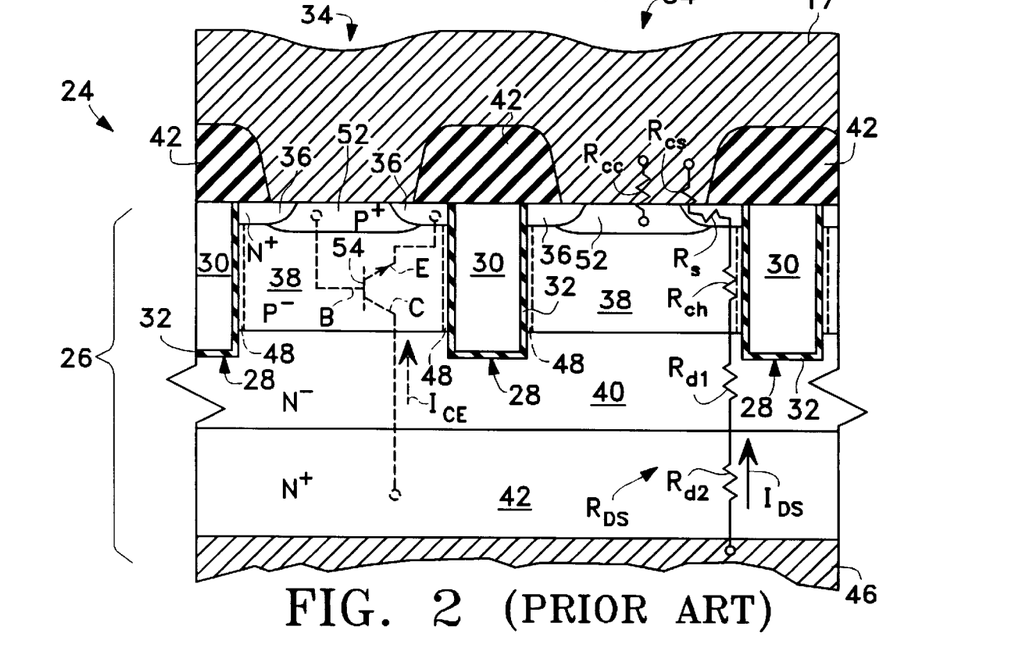
FIG. 2, as described above, is a cross-sectional view of a conventional trenched MOSFET cell array.

To avoid the aforementioned problems associated with dense integration, MOSFET structures with trenched gates have been devised. FIG. 2 shows a typical arrangement of trenched MOSFET array signified by the reference numeral 24 which includes a substrate 26. There is a plurality of trenches 28 filled with conducting material 30 which is electrically separated from the substrate 26 by a thin insulting layer 32. Each MOSFET cell 34 can be a N-channel device comprising a source layer 36 made of N-type material; a body layer 38 formed of P-type material; an epitaxial layer 40 composed of a lightly doped N-type material; and a drain contact layer 42 based on a heavily doped N-type material. Atop the trenches 28 are insulating layers 42 insulating the conductive material 30 from a source contact metal layer 17. There is also a drain metal contact layer 46 attached to the drain contact region 42 of the MOSFET 24. The conductive materials 30 in the trenched gates 28 are electrically connected together but are not shown in FIG. 2.

There are also cell contact regions 52 diffused in the substrate 26. The implementation of the cell contact regions 52 is to prevent triggering the parasitic NPN transistors 54 into action, which NPN transistors 54 are surreptitiously embedded in each MOSFET cell 34. As shown in FIG. 2, the source region 36 is of N-type which corresponds to the emitter E of the NPN transistor 54. Similarly, the body region 38 is of P-type conductivity which acts as the base B of the NPN transistor 24. The N-type drain 42 is the common collector of all the transistors 54 (only one is shown in FIG. 2). The body regions 38 are lightly doped regions and assume high resistivity. In accordance with Ohm's law, current passing through any resistive body region 38 generates a potential voltage difference. With the body regions 38 built in with a high resistivity, small amount of stray current passing through the regions 38 will suffice to generate a voltage of sufficient magnitude to turn on the base-to-emitter voltages $V_{BE}$ of the NPN transistors 54. Once the parasitic transistors 54 are turned on, they enter into the active conduction mode and sustain huge collector-to-emitter current $I_{CE}$ and cause irreparable damages to the MOSFET cells 34.

The presence of the cell contact regions 52 is to decrease the base-to-emitter resistivity of the NPN transistors 54 such that they can tolerate a reasonably high base-to-emitter current without exceeding the typical base-to-emitter voltage $V_{BE}$ which is about a potential difference drop of a diode of approximately 0.7 Volts.

As with the planar MOSFET array 2 shown in FIG. 1, the current path where the drain-to-source current $I_{DS}$ flows is resistive and its resistance is called the drain-to-source $R_{DS}$ of the MOSFET cell 34. The aggregate resistance values of the drain-to-source resistance $R_{DS}$ during the power-on state is called the power-on resistance $R_{ON}$ of the MOSFET array 24. Since the channels 48 are arranged in a vertical manner, the lateral current paths are basically eliminated. The problem of cell-to-cell encroachment competing for current flow is no longer an issue. That is, as different from the MOSFET array 2 with the planer configuration, the junction resistance $R_j$ of the drain-to-source resistance $R_{DS}$ is essentially removed, as shown in FIG. 2. Moreover, the drain resistance $R_{d1}$ in the epitaxial region 40 also has a relatively larger cross-sectional area for current to pass through due to the more spaced-apart relationship between the cells 34. The consequential benefit is that a higher degree of integration on a semiconductor substrate can be realized, which in turn provides lower power-on $R_{ON}$ resistance. Lower power-on resistance $R_{ON}$ curtails ohmic loss during the power-on state and further alleviates heat dissipation.

Advantageous as it appears, densely integrating the cells 34 necessitates packing more cells 34 per unit area on a semiconductor surface. As a consequence, each cell 34 is laid out with a smaller physical area having smaller contact surfaces for the source regions 36 and for the cell contact regions 52. Accordingly, cross-sectional areas for current flow through the regions 36 and 52 are also diminished resulting in increase in contact resistivity. Differently put, with reference to FIG. 2, the source contact resistance $R_{CS}$ and the cell contact resistance $R_{CC}$ of each cell 34 are increased due to the corresponding decrease in the individual geometrical areas of the source region 36 and the cell contact region 52 because of the overall reduction in area of each cell 34. As a consequence, the cell contact regions 52 are less effective in suppressing the parasitic transistors 54 during normal operations. Equally as undesirable is that the source contact resistance $R_{CS}$, and to a lesser extent, the source resistance $R_s$ in the source regions 36, emerge as the dominant components in the drain-to-source resistance $R_{DS}$ of the MOSFET 24 during the power-on state.

Thus, scaling down the geometrical areas of the cells in a MOSFET array does not appear to be a viable solution to reduce the power-on resistance $R_{ON}$ of the MOSFET array fabricated via high density integration. There is a minimum limit in cell area that each cell 34 must maintain. Beyond such a limit, the dominant effects of the source contact resistance $R_{CS}$ and the cell contact resistance $R_{CC}$ would negate any advantages of fabricating MOSFET arrays by way of high density integration.

Figure 3:
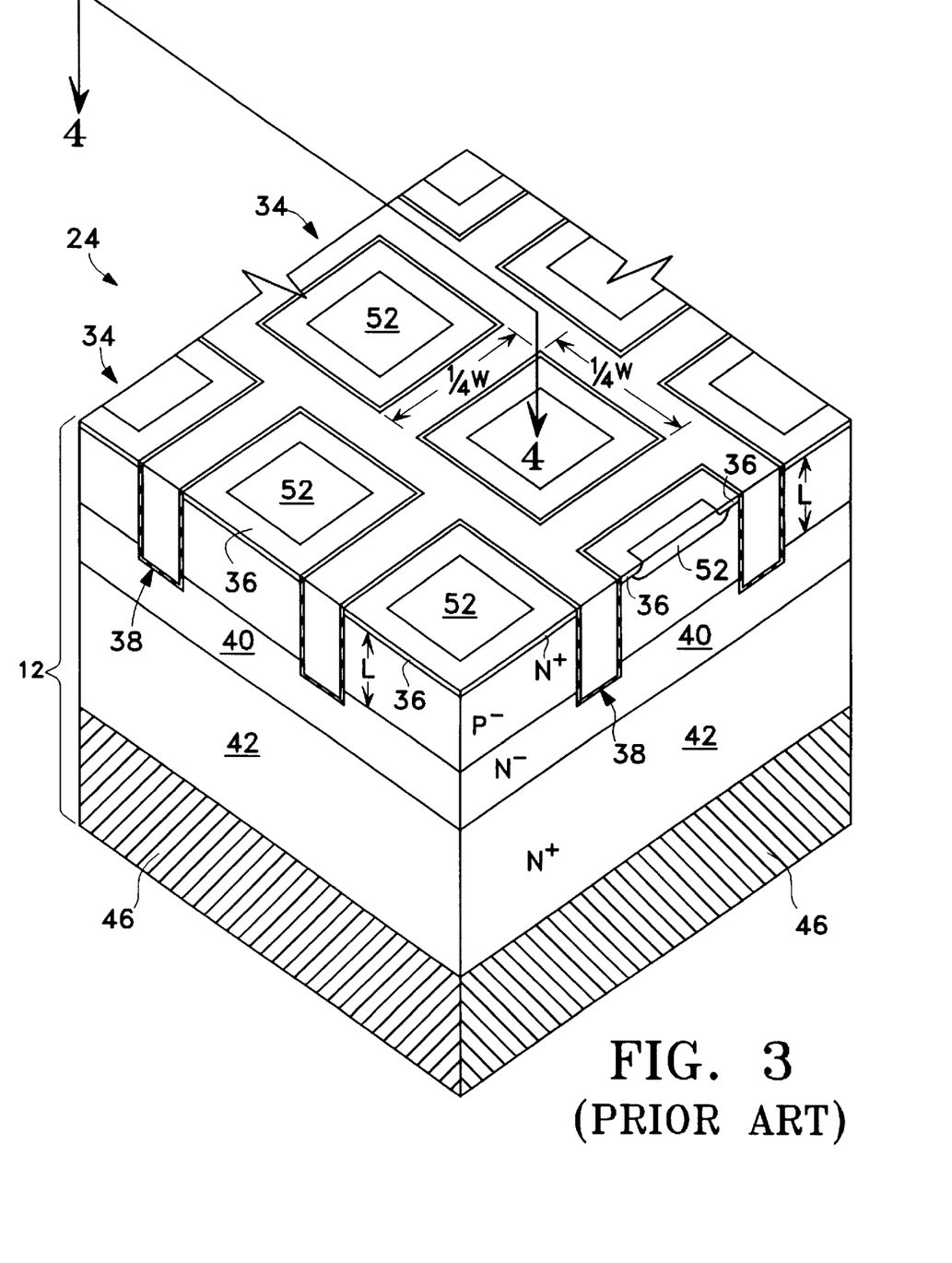
FIG. 3, as described above, is a perspective view, partially cut away, of the conventional MOSFET cell array shown in FIG. 2.
Figure 4:
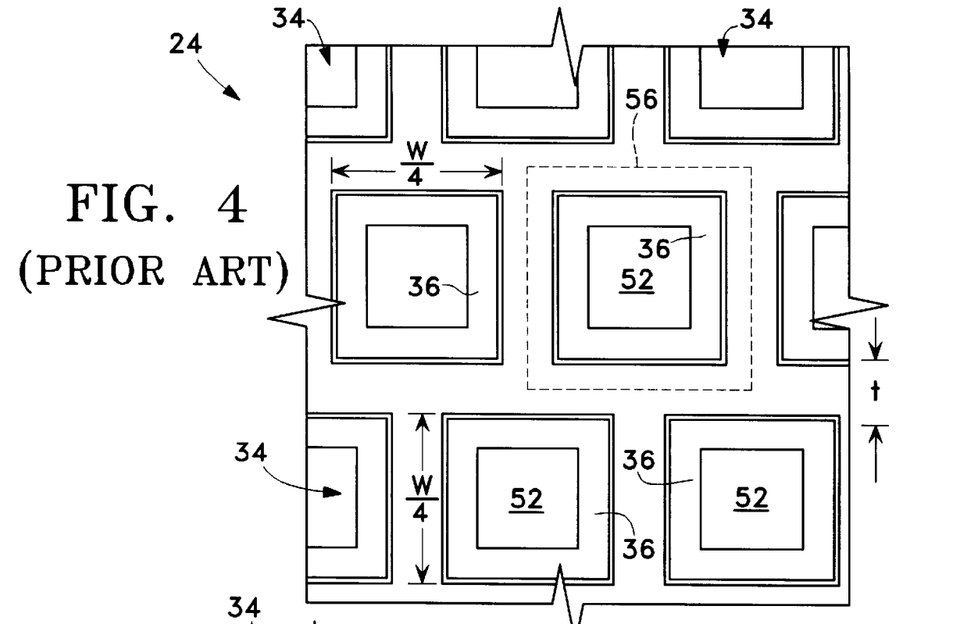
FIG. 4, as described above, is a top plan view of the conventional MOSFET cell array taken along the line 4—4 of FIG. 3.
Figure 5:
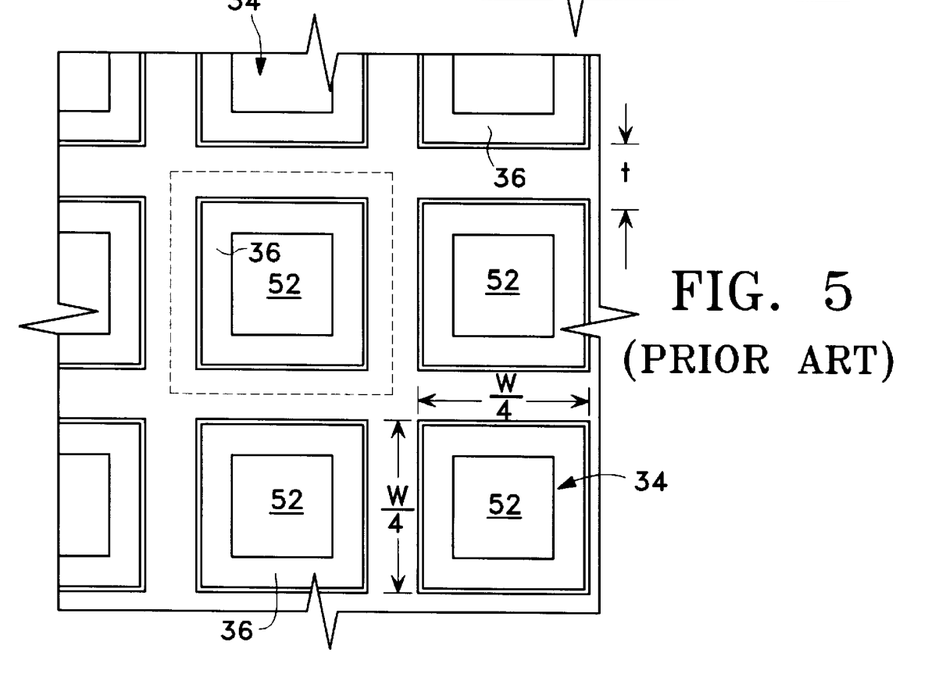
FIG. 5, as described above, is a top plan view showing an alternative cell arrangement of the conventional MOSFET cell array shown in FIGS. 2–4.

Prior to any further analysis, the configurations of the conventional MOSFET arrays need first be identified. FIG. 3 is a perspective view, partially cut away, showing the typical cell-to-cell arrangement of the MOSFET array 24. FIG. 4 is the top plan view taken along the line 4—4 of FIG. 3. FIGS. 3 and 4 are shown with the insulating and passivation layers removed exposing the relevant layers of the MOSFET array 24. The cell-to-cell arrangement of the array shown in FIGS. 3 and 4 are called the "brick wall" pattern in which the cells of any cell row are shifted by half a cell length with respect to the cells of the adjacent cell rows. Alternatively, the cells can be arranged in another pattern called the "waffle" pattern in which the cell rows and columns are geometrically aligned as shown in FIG. 5.

Figure 6:
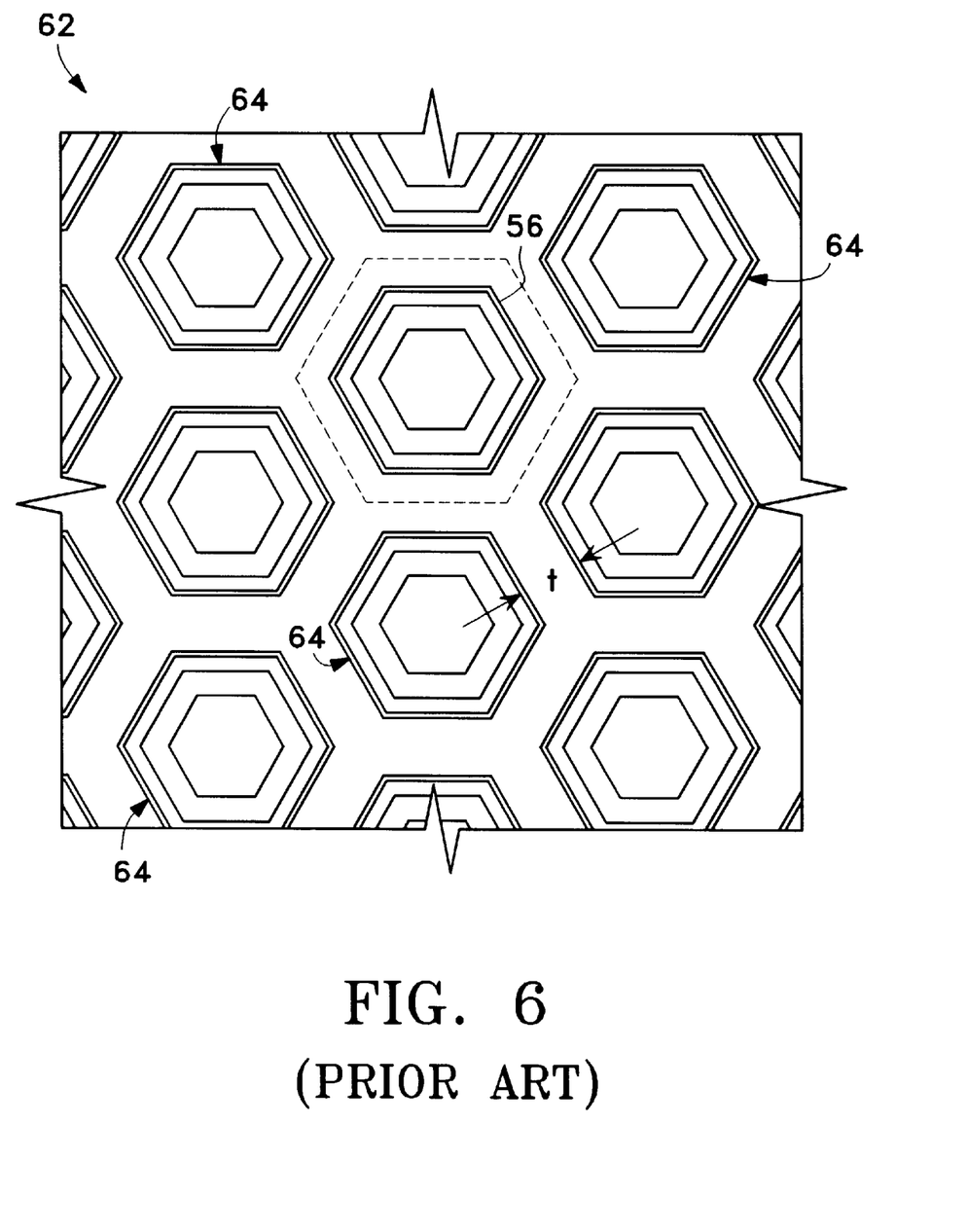
FIG. 6, as described above, is a top plan view of another conventional MOSFET cell array having hexagonal cells.

As another alternative, cells can be arranged in a "honey comb" pattern as disclosed in U.S. Pat. No. 5,072,266, Bulucea et al., entitled "Trench DMOS Power Transistor with Field-Shaping Body Profile and Three-Dimensional Geometry", issued Dec. 10, 1991. The "honey comb" pattern is illustrated in FIG. 6.

To alleviate the aforementioned problems of shrinkage in contact areas for the source regions 36 and the cell contact regions 52 (FIG. 2) due to dense integration, it is desirable that the power-on resistance $R_{ON}$ resistance decreases without any accompanying reduction in the source contact and cell contact areas associated with the regions 36 and 52. Phrased differently, with reference to FIGS. 1 and 2, in the fabrication of a high density MOSFET array with the state-of-the art high resolution photolithography, the ideal objective is to reduce the drain-to-source resistance $R_{DS}$ of each cell 19 or 34 without any concomitant increase in the source contact resistance $R_{CS}$ and the cell contact resistance $R_{CC}$.

The semiconductor array of the invention accomplishes the above-mentioned objective by extracting a longer cell boundary out of a fixed cell area. A longer cell boundary results in a longer channel width W for each cell 34 which in turn provides lower drain-to-source resistance $R_{DS}$.

As is known in the art, the power-on resistance $R_{ON}$ assumes the following algebraic relationship:

$$R_{ON} \propto \frac{L}{W} \tag{2}$$

where L is the channel length in $\mu$m; and W is the channel width in $\mu$m. With reference again to FIGS. 2–5, for a trenched MOSFET with a square cell configuration, the channel length L is the linear dimension extending from source region 36 to the epitaxial region 40 (FIG. 3). The channel width W is the length of the boundary enclosing each active cell 34. Each side of the square cell 34 is one quarter of the channel width W and is labelled W/4 in FIGS. 3–5.

Assuming the channel length L is a fixed parameter, and further assuming that the geometrical area for each cell 34 is also fixed such that there is no diminution in the area L sizes of the source regions 36 and the cell contact regions 52, a MOSFET cell with a lower power-on resistance $R_{ON}$ would result if a longer channel W can be designed to encompass each cell 34. The MOSFET array of the invention provides such a longer channel width W for each cell without any sacrifice or trade-offs with other parameters.

Instruments are now built with ever increasing complexity and decreasing physical sizes. To fully reap the advantages of high resolution photolithography, factors that hamper high density integration must be overcome. Specifically, semiconductor power devices, even fabricated with fine line geometry at high packing density, need to exhibit ruggedness in performance and with low power-on resistance. At the same time, production yield is not compromised with the improvement in performance. There has been a long-felt need to provide power devices meeting the aforementioned criteria.

SUMMARY OF THE INVENTION

It is accordingly the object of the invention to provide semiconductor cell arrays with high density cell integration and thus low power-on resistance without the conventional limitations associated with high density integration. The object of providing the aforementioned features in the cell arrays with no special tooling, thereby curtailing manufacturing costs is also sought.

The MOSFET device of the invention accomplishes the above objectives with a novel arrangement in which each semiconductor cell in the cell array is geometrically configured with a base portion and a plurality of protruding portions extending from the base portion. The central and protruding portions define a closed cell boundary enclosing each semiconductor cell. The closed cell boundary of each semiconductor cell is disposed proximal to and in geometrical accord with the corresponding cell boundaries of other adjacent semiconductor cells in the cell array. As arranged, the cell boundary and thus the channel width of each cell is extended without any corresponding change in cell area.

These and other features and advantages of the invention will be apparent to those skilled in the art from the following detailed description, taken together with the accompanying drawings, in which like reference numerals refer to like parts.

DETAILED DESCRIPTION OF THE INVENTION

Figure 7:
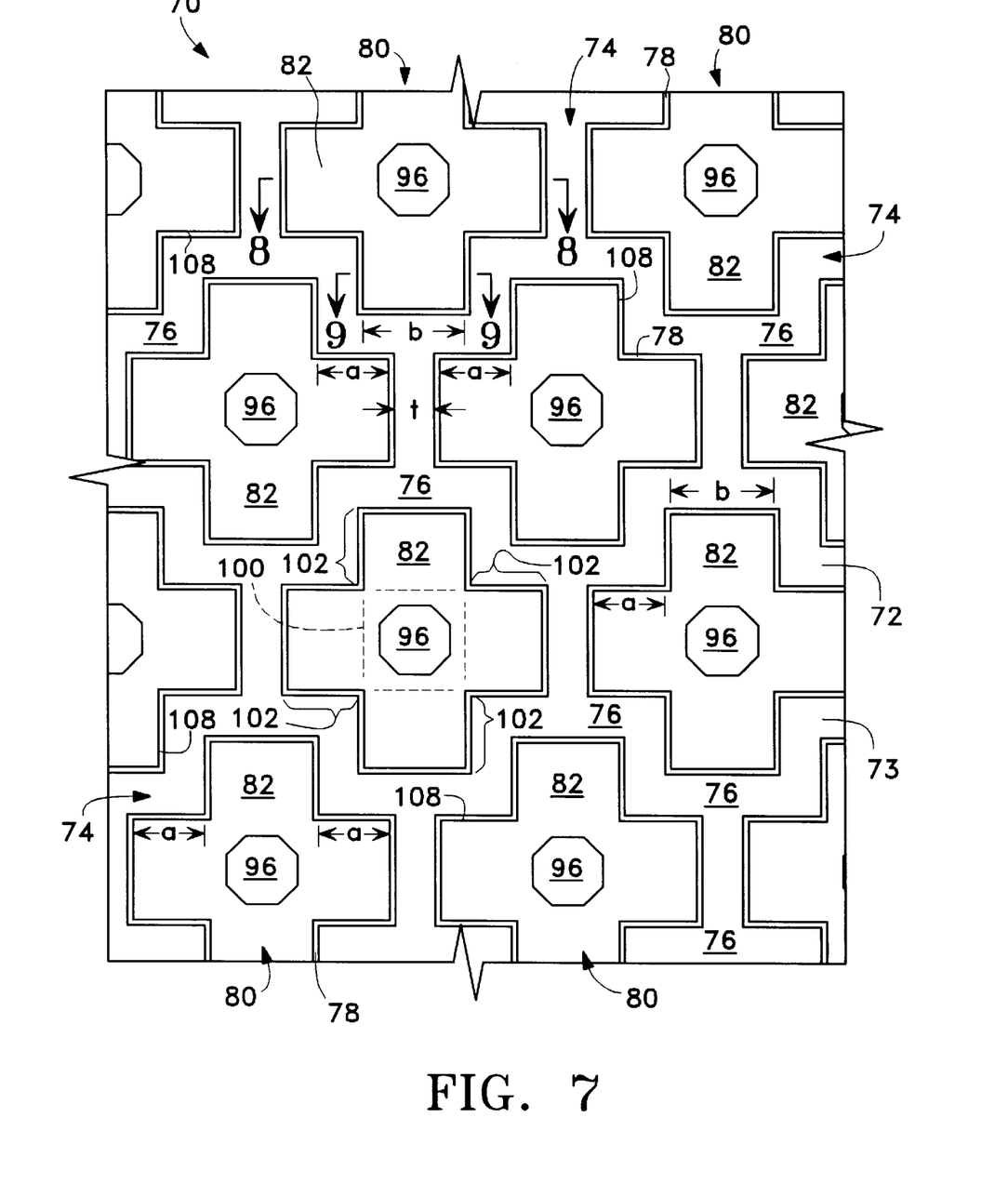
FIG. 7 is a top plan view of a first embodiment of the invention.
Figure 8:
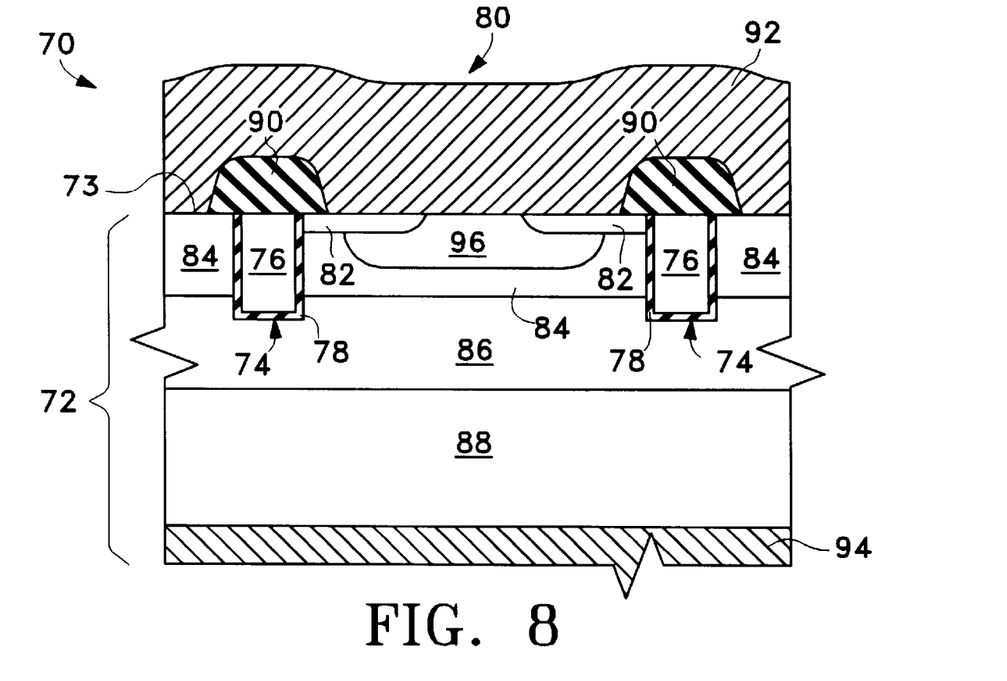
FIG. 8 is a cross-sectional view taken along the line 8—8 of FIG. 7.
Figure 9:
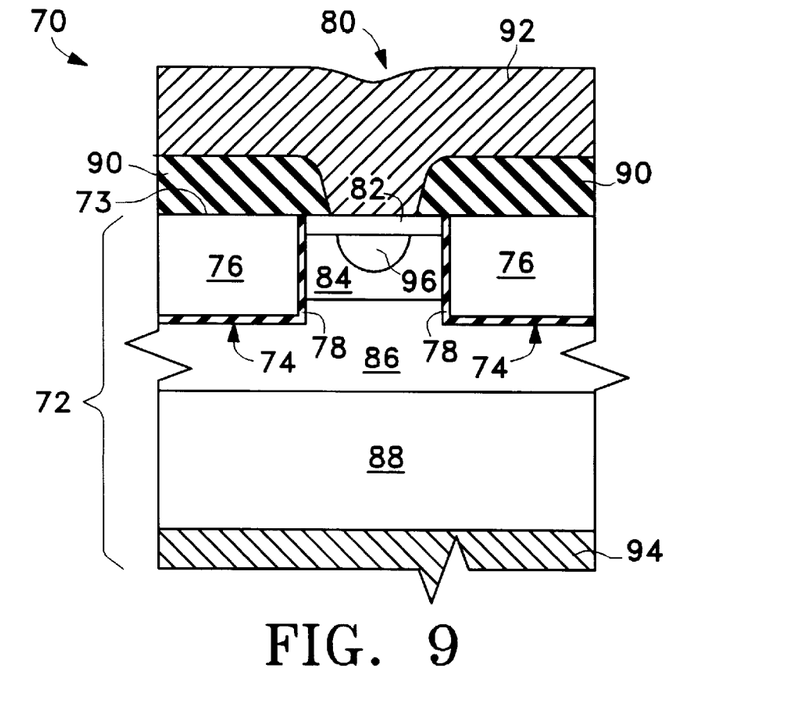
FIG. 9 is a cross-sectional view taken along the line 9—9 of FIG. 7.

Reference is now made to FIG. 7 which shows the top plan view of the first embodiment of the invention signified by the reference numeral 70. For the sake of clarity in illustration, the overlying metal, passivation and insulating layers of the MOSFET array 70 are removed exposing the relevant components of the array 70. However, the metal and insulating layers are shown in FIGS. 8 and 9 which are cross-sectional views taken along the lines 8—8 and 9—9, respectively, of FIG. 7. With reference to FIGS. 7–9, the MOSFET array 70 includes a substrate 72 having a major surface 73. Formed in the substrate 72 and beyond the major surface 73 is a plurality of trenches 74 filled with conducting material 76 which is electrically separated from the substrate 72 by a thin insulting layer 78. The array 70 includes a plurality of MOSFET cells 80. In this embodiment, each MOSFET cell 80 is an N-channel device comprising a source layer 82 made of N-type material; a body layer 84 formed of P-type material; an epitaxial layer 86 composed of a lightly doped N-type material; and a drain contact layer 88 based on a heavily doped N-type material. Atop the trenches 74 are insulating layers 90 insulating the conductive material 76 from a source contact metal layer 92. There is also a drain metal contact layer 94 affixed to the drain contact region 88. The conductive materials 76 in the trenched gates 78 are electrically connected together as shown in FIG. 7.

There are also cell contact regions 96 diffused in the body region 84 for providing operational ruggedness in the array 70. The presence of the cell contact regions 96 suppresses any parasitic transistor actions in the substrate 72 as was explained previously.

Reference is now directed back to FIG. 7. Each cell 80 in the array 70 geometrically includes a base portion 100 and a plurality of protruding portions 102 extending from the base portion 100. In this embodiment, for each cell 80, there are four protruding portions 102 extending beyond the base portion 100.

The cell configuration of each cell 80 and the cell-to-cell arrangement of the array 70 should be contrasted with the square cells 34 in the array 24 shown in FIGS. 2–5, and with the hexagonal cells 64 in the array 62 shown in FIG. 6. The underlying principle of the novel cell configuration and the cell-to-cell arrangement of the invention can be better explained with reference to FIGS. 10–13.

From basic geometry, for a fixed unit area A, it takes a longer boundary to enclose the unit area A if the boundary assumes certain geometrical shapes. As for illustration, the cross-shape 106 enclosing the unit area A has a boundary 108 longer than the corresponding boundary 110 enclosing the square 112 shown in FIG. 11. The boundary 110 of the square 112 in turn is longer than the boundary 114 of the hexagon 116 shown in FIG. 12. The shortest boundary enclosing the same unit area A is the round boundary 118 enclosing the circle 120. In fact, this explains why most conventional containers, be they for fluids or solids, are round in shape. The reason is a round container encompass the same volume of material with the shortest boundary which results in less material needed for fabricating the container. Thus, if the boundaries 108, 110, 114 and 118 respectively shown in FIGS. 10–13 correspond to the channel widths W of different MOSFET cells of equal cell areas, the cell with the cross-shape 106 has the longest boundary 108 and thus the longest channel width W and would assume all the advantages as explained previously.

Reference is now directed back to FIGS. 7–9. For a fixed cell area, with the unique cell shape design in accordance with the invention, the channel width W for each cell is substantially extended. As explained before, the drain-to-source resistance $R_{DS}$ of each MOSFET cell 80 and consequently the power-on resistance $R_{ON}$ of the entire array 70, is inversely proportional to the channel width W. That is, the larger the value of the channel width W, the lower is the drain-to-source resistance $R_{DS}$ for each MOSFET cell 80. Contrasting with the square cell arrangement shown in FIGS. 4 and 5, or the hexagonal cell arrangement shown in FIG. 6, for a fixed cell area, the MOSFET cell 80 of the invention arranged with the protruding portions 102 extending from the base portion 100 can stretch a longer cell periphery and therefore a lower channel width W comparing with the prior art counterparts. There is a multiplicity of MOSFET cells 80 in the array 70. With the novel arrangement of the invention, the reduction in overall power-on resistance $R_{ON}$ of the array 70 can be significant.

Figures 10, 11, 12, 13, 14, 15, 16:
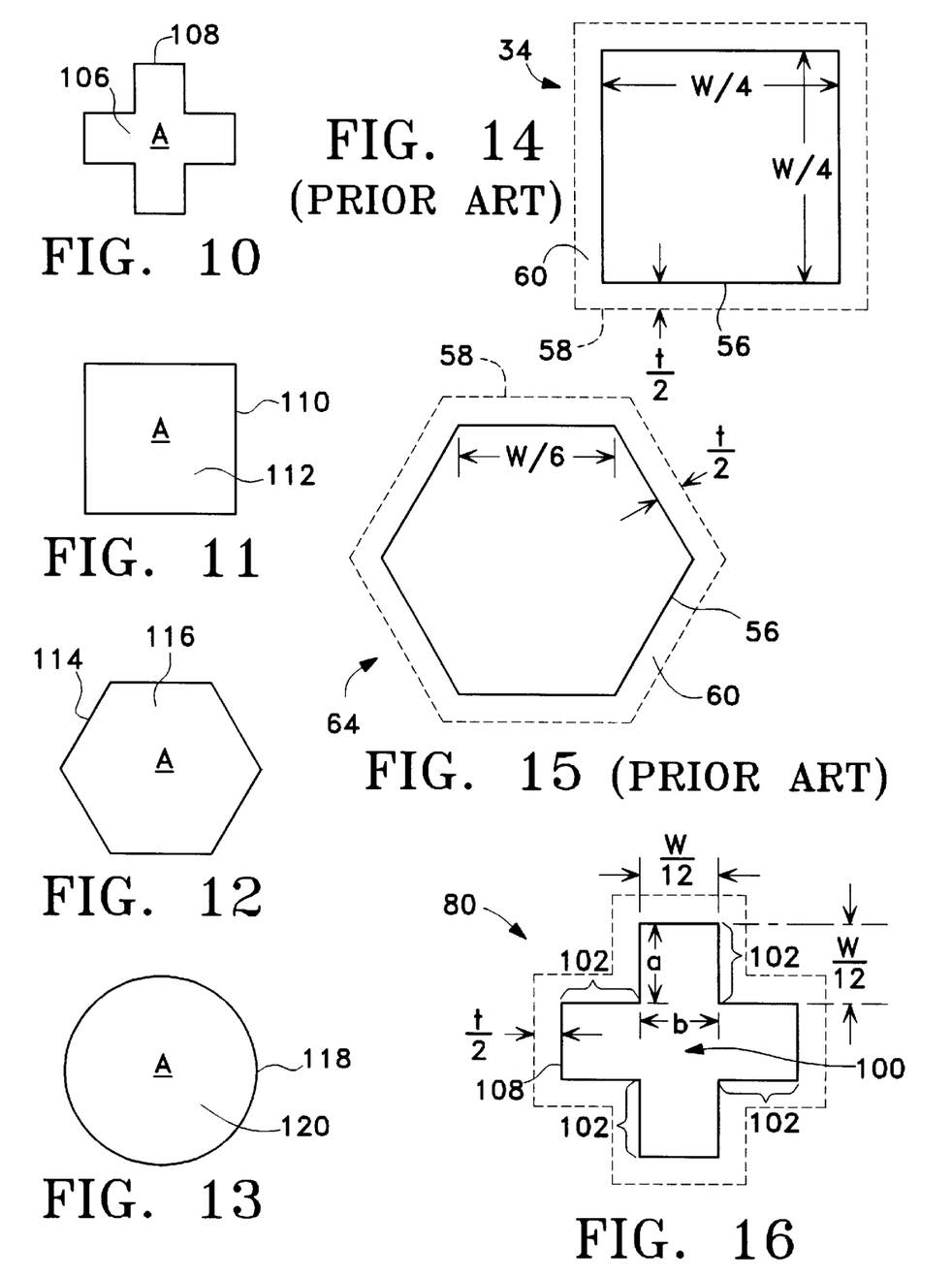
FIGS. 10–13 are schematic views illustrating the relationship of the boundary length to a fixed unit area of various geometrical shapes.
FIG. 14 is a schematic view of a square cell showing the associated channel width and cell area for the definition of the packing density parameter.
FIG. 15 is a schematic view of a hexagonal cell showing the associated channel width and cell area for the definition of the packing density parameter.
FIG. 16 is a schematic view of the cell of the invention showing the associated channel width and cell area for the definition of the packing density parameter.

For a quantitative comparison, in this specification, a parameter called the packing density PD for each MOSFET cell is defined. The packing density PD parameter is an useful quantitative tool in the design of the geometrical shape of a cell in accordance with the invention. Reference is now referred back to FIGS. 4 and 5 and highlighted in FIG. 14 for illustration, with the prior art square cell, the packing density PD is defined as the ratio of the length of the boundary 56 enclosing the active region of the cell 34, to the unit cell area 60 which is enclosed by the hidden line 58 as shown in FIG. 6. Specifically, in the square cell arrangement as shown in FIGS. 4–6, the length of the cell boundary 56 is W, where W is the channel width of each cell 34. The unit cell area is $[(W/4)+t]^2$, where W is as defined above and t is the separation of the active regions of the neighboring cells. Thus the packing density ratio PD for the MOSFET array 24 is expressed as follows:

$$PD = \frac{16W}{(W + 4t)^2} \quad (3)$$

In high resolution photolithography, with the square cell arrangement as shown in FIGS. 4–6, cell-to-cell separation t can be set at $1\mu$. The channel width W can be scaled to $14\mu$. Substituting the values into the equation (2), the packing density PD is approximately 0.69 which is less than 0.70.

Applying the same method to the cell arrangement with the "honey comb" pattern shown in FIG. 6 and highlighted in FIG. 15, it can be found that the packing density PD of the array 62 is expressed by the following equation:

$$PD = \frac{13.8W}{(W + 3t)^2} \quad (4)$$

Again, assuming the cell-to-cell separation t can be set at $1\mu$. The channel width W can be scaled to $14\mu$. Substituting the values into the equation (4), the packing density PD is approximately 0.67.

Reference is directed back to FIGS. 7–9 and highlighted in FIG. 16. Assuming that for the cell 80, each protrusion 102 portion has a width b and a length a. It should be noted that the width b and the length a need not be equal in dimension. The length of the boundary 108 of the cross-shape cell 80 is W which is the channel width of each cell 80. The packing density for the array arrangement with the cell 80 can be expressed by the following algebraic equation:

$$PD = \frac{64W}{3(W + 4t)^2} \quad (5)$$

Again, assuming the cell-to-cell separation t can be set at $1\mu$. The channel width W can be scaled to $14\mu$. Substituting the values into the equation (5), the packing density PD is approximately 0.92.

The packing density PD set forth in each of the equations (3)–(5) expresses the relationship between the boundary length supported by each per unit area for a cell with a particular shape. With the per unit area of each cell being fixed due to the concern of undersized source contact regions and the cell contact regions, it is desirable to have a longer boundary surrounding each unit area as explained above. That is, in the design of a cell array, a higher packing density PD is preferred. In the examples described above, with the exemplary values of the channel width set at 14 $\mu$m and the cell-to-cell separation set at 1 $\mu$m, the array arrangement of the invention assumes a packing density PD of 0.92 which is higher than any other arrangements such as the square cell arrangement with a packing density PD of 0.70 and the hexagonal cell arrangement with a packing density PD of 0.67.

Figure 17:
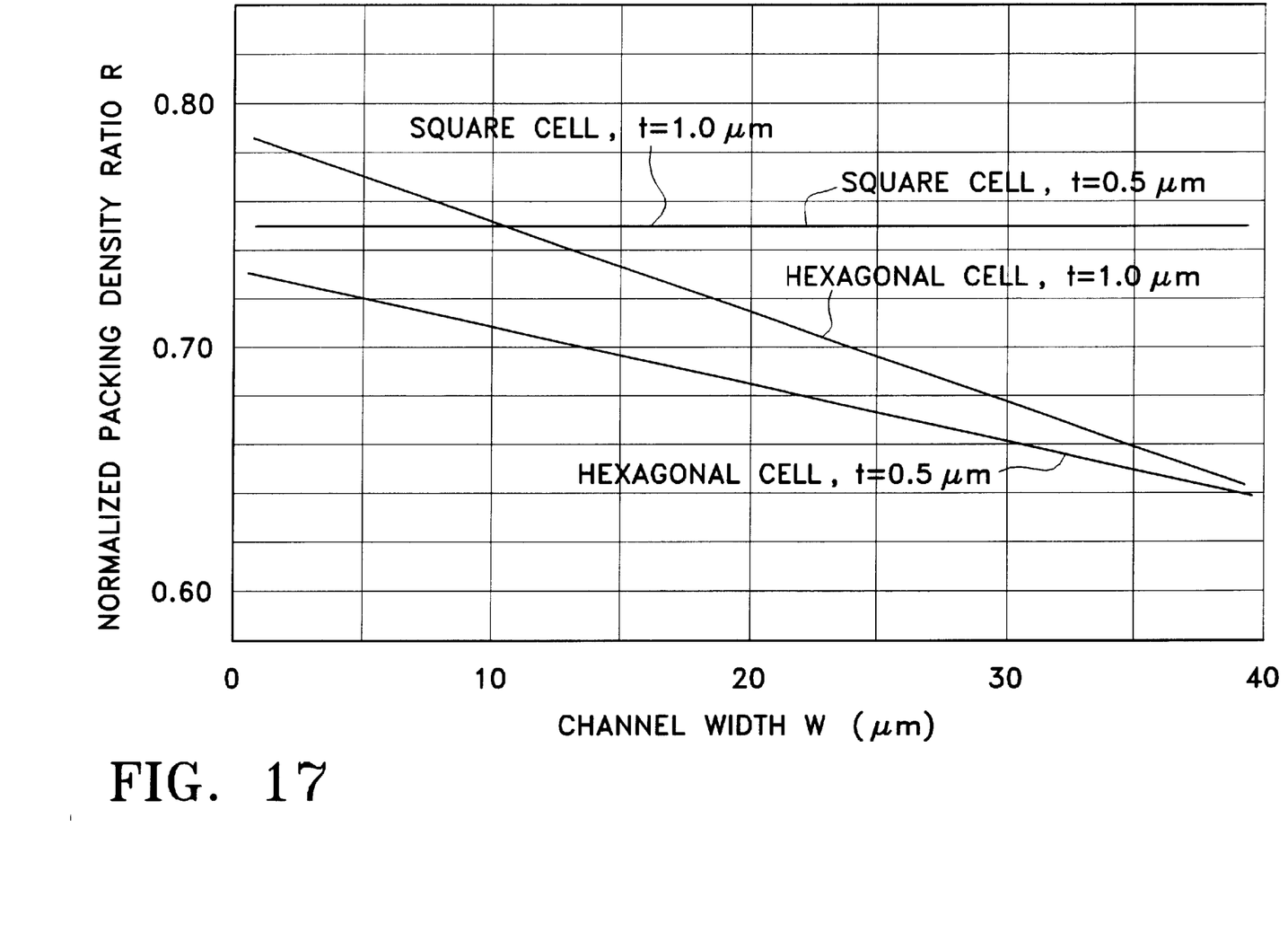
FIG. 17 is a graphical representation of the normalized packing density parameter as a function of channel width of various MOSFET arrays.

FIG. 17 shows a graphical representation of the relative relationship of the packing densities of different cell arrangements as a function of the channel width W. The ordinate of the graph shown in FIG. 17 represents the normalized packing density ratio R, which is the ratio of the packing density of the prior art cell array to the packing density of the cell array of the invention. The abscissa represents the channel width W.

For the square cell arrangements shown in FIGS. 3–5 and 14, the packing density PD is only 75% of the packing density PD of the invention. That is, the normalized ratio R is 0.75 and is independent of the channel width W or cell-to-cell separation t. For the hexagonal cell arrangements, such as the arrangement shown in FIGS. 6 and 15, the normalized packing density ratio R varies with other parameters. Specifically, the normalized ratio R decreases with increase in channel width W, but decreases with decrease in cell-to-cell separation t.

Thus, the normalized packing density ratio R parameter provides yet another useful tool in determining and comparing cell configurations and arrangements in designing cell arrays. As shown in FIG. 17, within the practical ranges, the normalized packing density R is below unity. That is, the array 70 of the invention assumes a higher packing density PD value than any prior art cell arrays as described.

Theoretically, each cell 80 with more protruding portions 102 extending out from the base portion 100 provides a longer boundary line 108 for a cell with a fixed area. However, the cells 80 have to be repetitively arranged in the array 70 with minimal waste of space. In the preferred embodiment, the geometry of each cell 80 has four protruding portions 102 extending from the base portion 100. To meet the requirement for repetitiveness, the sum of the width b of the protruding portion 102 and the cell-to-cell separation t should be equal to twice the length a of the protrusion portion 102. Mathematically, it is expressed as follows:

$$2a=b+t \qquad (6)$$

Figure 18:
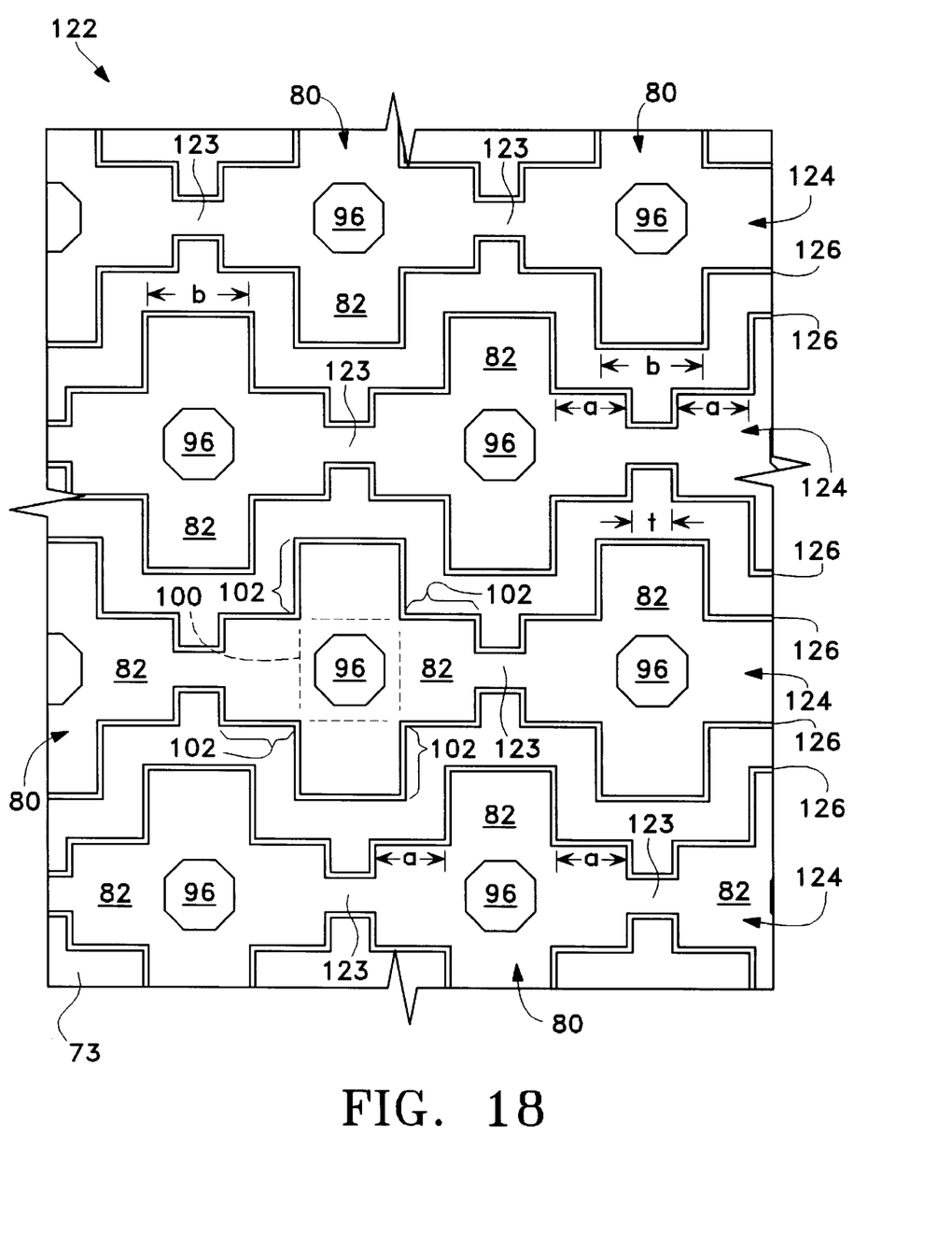
FIG. 18 is a top plan view of a second embodiment of the invention.

FIGS. 18 shows a second embodiment of the invention. The cell array of this embodiment is signified by the reference numeral 122. Again, the overlying metal, passivation and insulating layers of the MOSFET structure 122 are removed for ease of illustration. The structure 122 includes a plurality of MOSFET cells 80. However, individual cells 80 in each row of the array 122 are geometrically connected together by connecting bridges 123 to form an elongated MOSFET cell 124. In the array 122, there is a plurality of elongated MOSFET cells 124 which are spaced from each other by a plurality of corrugated boundaries 126. The corrugated boundary 126 of each cell 124 is disposed in geometrical accord with the corresponding boundaries 126 of the other cells 24 on the semiconductor surface 73. Specifically, the protruding portion 102 of any cell 124 substantially fits into the space between the protruding portions 102 of other adjacent cells 124, such that minimal space is wasted in terms of cell layout on the semiconductor surface 73. The array 122 in this embodiment can assume a higher packing density PD if the cell-to-cell separation t is large in comparison to the width b of each protruding portion 102. The connecting bridges 123 basically extend the cell boundary of each cell 80 further.

As with the previous embodiment, there are also source regions 82, and cell contact regions 96 diffused in the body region 84 for providing operational ruggedness by suppressing any parasitic transistor actions as explained previously and is not repeated in here.

Figure 19:
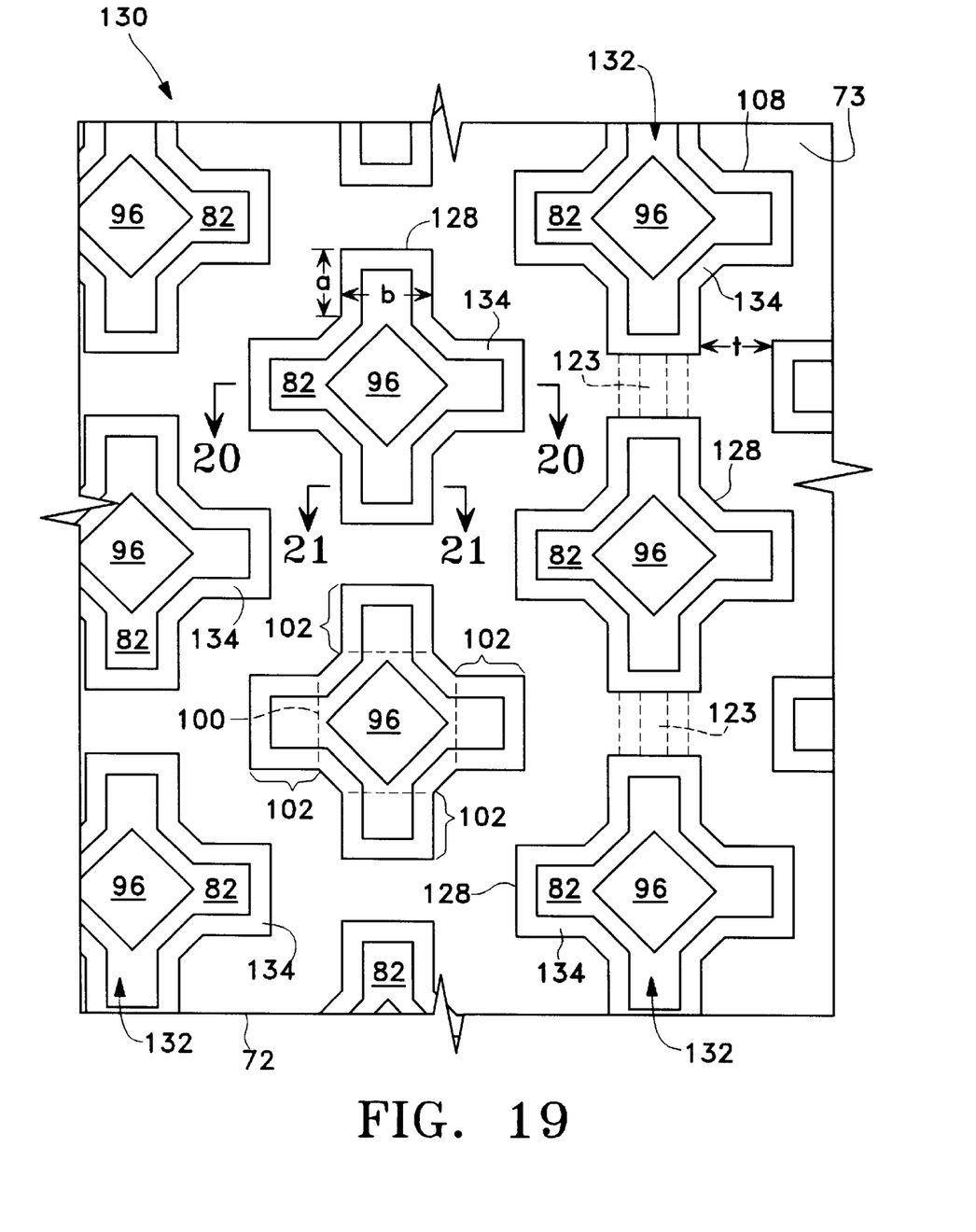
FIG. 19 is a top plan view of a third embodiment of the invention.
Figure 20:
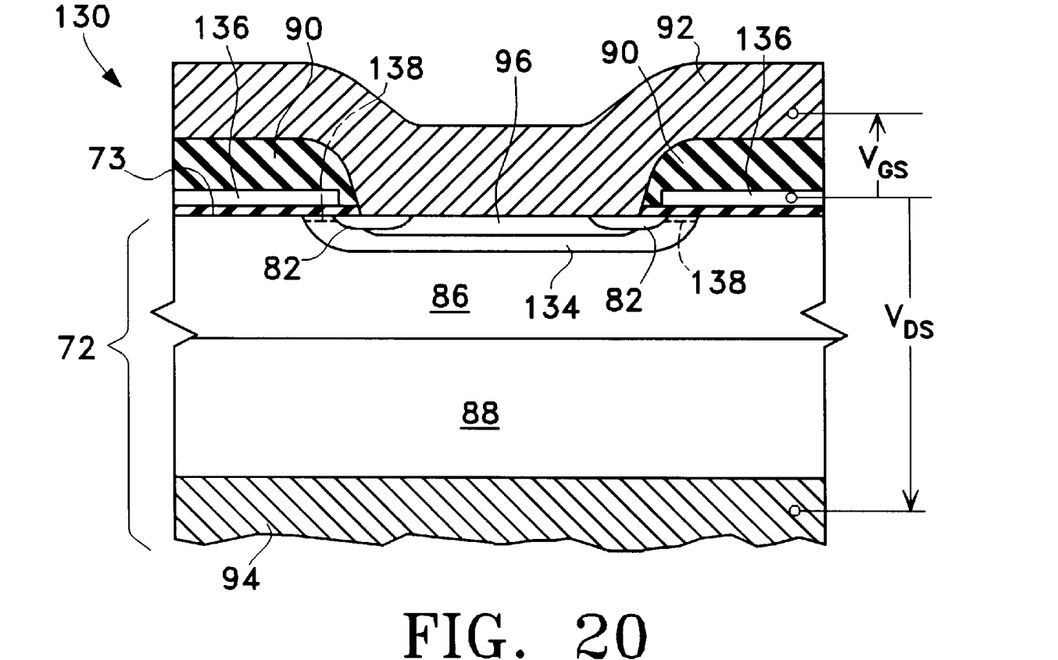
FIG. 20 is a cross-sectional view taken along the line 20—20 of FIG. 19.
Figure 21:
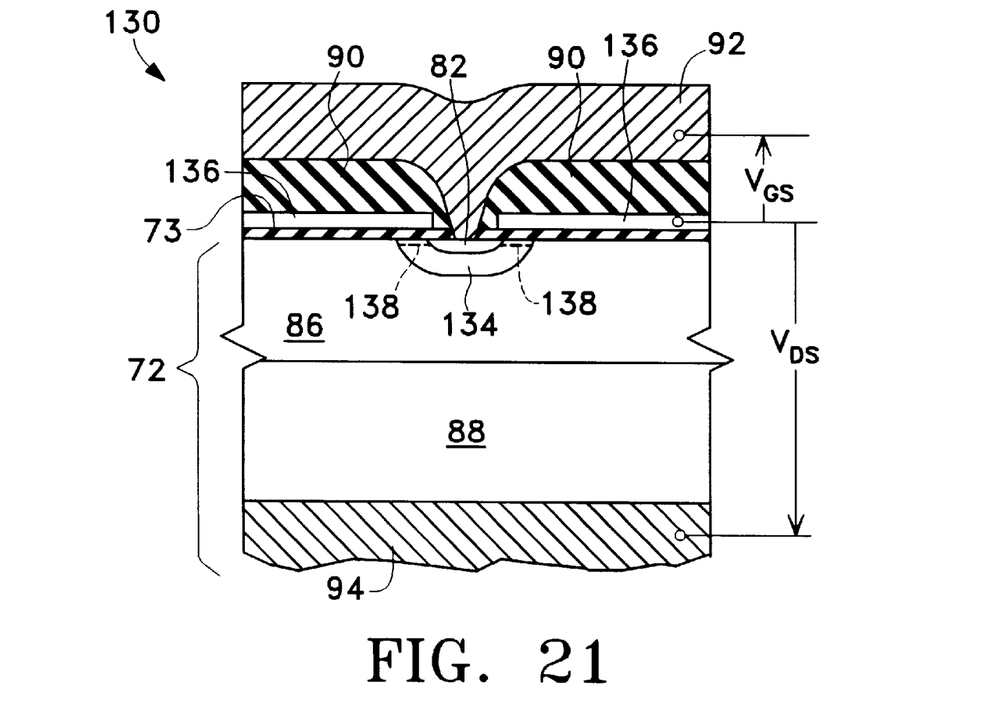
FIG. 21 is a cross-sectional view taken along the line 21—21 of FIG. 19.

FIGS. 19–21 show a third embodiment of the invention. The cell array of this embodiment is a planar MOSFET array signified by the reference numeral 130. Again, the overlying metal, passivation, polycrystalline gate and insulating layers of the MOSFET structure 130 are removed for clarity. However, the metal and insulating layers are shown in FIGS. 20 and 21 which are cross-sectional views taken along the lines 20—20 and 21—21, respectively, of FIG. 19. With reference to FIGS. 19–21, the MOSFET structure 130 includes a substrate 72 having a major surface 73. The array 130 includes a plurality of MOSFET cells 132. In this embodiment, each MOSFET cell 132 is an N-channel device comprising a source layer 82 made of N-type material, a body diffusion region 134 formed of P-type material, an epitaxial layer 86 composed of a lightly doped N-type material, and a drain contact layer 88 based on a heavily doped N-type material. Atop the major surface 73 and electrically insulated therefrom are a plurality of polycrystalline gates 136. There are insulating layers 90 disposed above the polycrystalline gates 136 insulating the gates 136 from a source contact metal layer 92. There is also a drain metal contact layer 94 affixed to the drain contact region 88. The conductive materials 76 in the trenched gates 78 are electrically connected together as shown in FIG. 7.

In a similar manner with the previous embodiments, cell contact regions 96 are also diffused in the body diffusion region 134 for providing operational ruggedness by suppressing any parasitic transistor actions as explained previously.

During normal operations, the sources 82 are connected to the ground potential. At the same time, a positive potential is applied across the drain metal 94 and the source metal 92. A drain-to-source voltage $V_{DS}$ is established. In a similar fashion, a gate-to-source voltage $V_{GS}$ is also applied across the gates 136 and the source metal 92. The $V_{GS}$ voltage capacitively induces N-type channels 138 underneath the polycrystalline gates 136. The channel 138 allows the $V_{DS}$ voltage to drive a drain-to-source current $I_{DS}$ from the drain metal 94 to the source metal 92. The MOSFET 130 is said to be at the power-on state.

In a fashion similar to the previous embodiments, each cell 132 in the array 130 geometrically includes a base portion 100 and a plurality of protruding portions 102 extending from the base portion 100. The portions 100 and 102 form a closed boundary 128 which is disposed on the semiconductor surface 73 proximal to and in geometrical accord with the corresponding cell boundaries 128 of other adjacent semiconductor cells 132 in the cell array 130.

As with the previous embodiments, each protruding portion 102 has a width b and a length a. To meet the condition of repetitiveness, the sum of the width b of the protruding portion 102 and the cell-to-cell separation t should be equal to twice the length a of the protrusion portion 102, in accordance with equation (6) shown above.

Finally, other changes are possible within the scope of the invention. As mentioned before, connecting bridges 123 can be incorporated in the array 130 shown in FIGS. 19–21 geometrically linking the cells 132 in a row together to provide a longer boundary length. Furthermore, the conductivity types of the layers may very well be different from that as depicted in the specification. In the embodiments described, the semiconductor structures are N-channel MOSFET devices. The structures can well be built as P-channel devices with corresponding changes of the fabrication steps. Moreover, the protruding portions 102 need not be symmetrically extended from the base portion 100. That is, the protruding portions 102 may well be irregularly extended from the base portion 100. In addition, the device fabricated in accordance with the invention need not be a power MOSFET. It can well be slightly modified and used for other types of device, such as a dynamic random access memory (DRAM) cell, an insulated gate bipolar transistor (IGBT), or a charge-coupled-device (CCD), to name just a few. It will be understood by those skilled in the art that these and other changes in form and detail may be made therein without departing from the scope and spirit of the invention.

What is claimed is:

1. A semiconductor cell array comprising:

a semiconductor substrate having a major surface; and a plurality of semiconductor cells, each of said semiconductor cells being geometrically configured with a base portion and a plurality of protruding portions extending from said base portion such that said base and said protruding portions define a closed cell boundary enclosing each of said semiconductor cells;

wherein said plurality of semiconductor cells being formed on said major surface with said closed cell boundary of each of said semiconductor cells being disposed in geometrical accord with the corresponding cell boundaries of other adjacent semiconductor cells in said cell array, such that each of said protruding portions of each of said semiconductor cells being proximally extended into the space separated by the protruding portions of said other adjacent semiconductor cells on said major surface.

2. The semiconductor cell array as said forth in claim 1 wherein each of said semiconductor cells being geometrically configured with one base portion and four protruding portions extending from said base portion.

3. The semiconductor cell array as said forth in claim 2 wherein said closed cell boundary is cross-shaped.

4. The semiconductor cell array as said forth in claim 3 wherein each of said protruding portions includes a width and a length, and wherein said closed boundary is disposed at a predetermined separation from the corresponding cell boundaries of other adjacent semiconductor cells in said cell array, such that each of said cells being geometrically configured and disposed on said major surface with the sum of said width and said predetermined separation being equal to twice said length.

5. The semiconductor cell array as set forth in claim 1 wherein each of said semiconductor cells includes a source region and a cell contact region, each of said semiconductor cells is configured with said closed cell boundary surrounding said source region which in turn surrounds said cell contact region.

6. The semiconductor cell array as set forth in claim 1 wherein selected protruding portions of each of said semiconductor cells are geometrically connected with other selected protruding portions of other adjacent semiconductor cells of said cell array via connecting bridges.

7. The semiconductor cell array as set forth in claim 1 wherein each of said semiconductor cells is a trenched field-effect transistor.

8. The semiconductor cell array as set forth in claim 1 wherein each of said semiconductor cells is a planar field-effect transistor.

9. A semiconductor cell array comprising:
   a semiconductor substrate having a major surface; and
   a plurality of semiconductor cells formed on said major surface, each of said semiconductor cells being geometrically configured with a base portion and four protruding portions extending from said base portion such that said base and said protruding portions form a closed cross-shaped boundary enclosing each of said semiconductor cells, such that each of said protruding portions of each of said semiconductor cells being proximally extended into the space separated by the protruding portions of said other adjacent semiconductor cells on said major surface.

10. The semiconductor cell array as set forth in claim 9 wherein each of said semiconductor cells includes a source region and a cell contact region, each of said semiconductor cells is configured with said closed boundary surrounding said source region which surrounds said cell contact region.

11. The semiconductor cell array as said forth in claim 10 wherein each of said protruding portions includes a width and a length, said closed boundary is disposed at a predetermined separation from the corresponding cell boundaries of other adjacent semiconductor cells in said array, said plurality of semiconductor cells being formed on said major surface with said closed cell boundary of each of said semiconductor cells proximally disposed and in geometrical accord with the corresponding cell boundaries of other adjacent semiconductor cells of said cell array such that each of said semiconductor cells being geometrically configured and disposed on said major surface with the sum of said width and said predetermined separation being equal to twice said length.

12. The semiconductor cell array as set forth in claim 11 wherein selected protruding portions of each of said semiconductor cells are geometrically connected with other selected protruding portions of other adjacent semiconductor cells of said cell array.

13. The semiconductor cell array as set forth in claim 12 wherein each of said semiconductor cells is a trenched field-effect transistor.

14. The semiconductor cell array as set forth in claim 12 wherein each of said semiconductor cells is a planar field-effect transistor.

15. The semiconductor cell array as set forth in claim 11 wherein each of said semiconductor cells is a trenched field-effect transistor.

16. The semiconductor cell array as set forth in claim 11 wherein each of said semiconductor cells is a planar field-effect transistor.

17. A semiconductor cell array comprising:
   a semiconductor substrate having a major surface; and
   a plurality of semiconductor cells formed on said major surface, each of said semiconductor cells being geometrically configured with a base portion and four protruding portions extending from said base portion, such that said base and said protruding portions form a closed cross-shaped boundary enclosing each of said semiconductor cells;
   wherein each of said protruding portions includes a length a and a width b, said closed boundary is disposed at a predetermined separation t from the corresponding cell boundaries of other adjacent cells in said cell array, said plurality of semiconductor cells being formed on said major surface with said closed cell boundary of each of said semiconductor cells proximally disposed and in geometrical accord with the corresponding cell boundaries of other adjacent semiconductor cells of said cell array on said major surface in accordance with the mathematical relationship: $2a=b+t$.

18. The semiconductor cell array as set forth in claim 17 wherein each of said semiconductor cells is a trenched field-effect transistor.

19. The semiconductor cell array as set forth in claim 17 wherein each of said semiconductor cells is a planar field-effect transistor.

* * * * *